(12) United States Patent
Zang et al.

(10) Patent No.: US 10,629,694 B1
(45) Date of Patent: Apr. 21, 2020

(54) GATE CONTACT AND CROSS-COUPLING CONTACT FORMATION

(71) Applicant: GLOBALFOUNDRIES Inc., Grand Cayman (KY)

(72) Inventors: Hui Zang, Guilderland, NY (US); Ruilong Xie, Niskayuna, NY (US); Haiting Wang, Clifton Park, NY (US); Scott Beasor, Greenwich, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/206,231

(22) Filed: Nov. 30, 2018

(51) Int. Cl.
| H01L 29/423 | (2006.01) |
| H01L 29/78 | (2006.01) |
| H01L 21/762 | (2006.01) |
| H01L 29/66 | (2006.01) |
| H01L 21/3213 | (2006.01) |
| H01L 29/417 | (2006.01) |

(52) U.S. Cl.
CPC .. *H01L 29/42384* (2013.01); *H01L 21/32133* (2013.01); *H01L 21/76232* (2013.01); *H01L 29/41733* (2013.01); *H01L 29/66803* (2013.01); *H01L 29/785* (2013.01)

(58) Field of Classification Search
None
See application file for complete search history.

(56) References Cited

U.S. PATENT DOCUMENTS

| 7,853,324 | B2 | 12/2010 | Stevenson et al. | |
| 9,006,841 | B2 | 4/2015 | Kumar et al. | |
| 9,608,065 | B1* | 3/2017 | Bergendahl | H01L 27/0886 |
| 2007/0112398 | A1 | 5/2007 | Stevenson et al. | |
| 2009/0163980 | A1 | 6/2009 | Stevenson | |
| 2017/0018464 | A1* | 1/2017 | Kim | H01L 21/823871 |

\* cited by examiner

*Primary Examiner* — Dung A. Le
(74) *Attorney, Agent, or Firm* — Thompson Hine LLP; Francois Pagette

(57) ABSTRACT

Methods of forming cross-coupling contacts for field-effect transistors and structures for field effect-transistors that include cross-coupling contacts. A sidewall spacer is formed adjacent to a gate structure, a dielectric cap is formed over the gate structure and the sidewall spacer, and an epitaxial semiconductor layer is formed adjacent to the sidewall spacer. A first portion of the dielectric cap is removed from over the sidewall spacer and the gate structure to expose a portion of a top surface of a gate electrode of the gate structure. A portion of the sidewall spacer is modified with an amorphization process. The modified portion of the sidewall spacer and the underlying gate dielectric layer are removed to expose a portion of a sidewall of the gate electrode. A cross-coupling contact is formed that directly connects the portions of the sidewall and top surface of the gate electrode with the epitaxial semiconductor layer.

20 Claims, 11 Drawing Sheets

GATE CONTACT AND CROSS-COUPLING CONTACT FORMATION

BACKGROUND

The present invention relates to semiconductor device fabrication and integrated circuits and, more specifically, to methods of forming gate contacts and cross-coupling contacts for field-effect transistors, as well as structures for field effect-transistors that include gate contacts and cross-coupling contacts.

Contacts may provide vertical electrical connections extending to features of semiconductor devices, such as the gate electrode and source/drain regions of a field-effect transistor. Self-aligned contacts are formed in contact openings that are constrained during etching by the configuration of adjacent structures, such as sidewall spacers and gate caps associated with the gate electrodes, as opposed to being constrained by a patterned resist.

Self-aligned contacts connected with the gate electrodes of field-effect transistors may be categorized into distinct types. One type of self-aligned contact, which is only connected with a gate electrode, is electrically isolated from nearby features, such as the epitaxial semiconductor material forming the source and drain regions of the field-effect transistor. Another type of self-aligned contact cross-couples a gate electrode with the epitaxial semiconductor material forming either the source region or drain region of the field-effect transistor, and may be used, for example, to provide cross-coupling of inverters in a logic cell. When forming a self-aligned cross-coupling contact, the top surface of the gate electrode is opened by at least partial removal of a gate cap.

A self-aligned contact providing cross-coupling may be weak if the constituent conductor formed over the gate electrode is overly thin. Such over thinning may occur during polishing to planarize the conductor that is deposited to form the self-aligned cross-coupling contact. In addition, the semiconductor material forming the related source region or drain region may be exposed to the etching process that at least partially removes the dielectric cap to open the top surface of the gate electrode, which can damage the semiconductor material.

Improved methods of forming self-aligned gate contacts and cross-coupling contacts for field-effect transistors, as well as structures for field effect-transistors that include self-aligned gate contacts and cross-coupling contacts, are needed.

SUMMARY

In an embodiment of the invention, a structure includes a semiconductor fin, a first sidewall spacer, a second sidewall spacer, and a first structure having an overlapping arrangement with the semiconductor fin. The gate structure includes a gate electrode and a gate dielectric arranged between the first sidewall spacer and the second sidewall spacer. The first gate electrode has a top surface and a sidewall adjacent to the first sidewall spacer. The structure further includes an epitaxial semiconductor layer arranged adjacent to the sidewall of the gate electrode, and a cross-coupling contact extending over the first sidewall spacer to connect the first gate electrode with the first epitaxial semiconductor layer. The cross-coupling contact has a directly contacting relationship with a first portion of the top surface of the first gate electrode and a portion of the first sidewall of the first gate electrode.

In an embodiment of the invention, a method includes forming a gate structure that includes a gate electrode and a gate dielectric layer, forming a sidewall spacer adjacent to a sidewall of the gate electrode, forming a dielectric cap over the gate structure and the sidewall spacer, and forming an epitaxial semiconductor layer adjacent to the sidewall spacer. A portion of the dielectric cap is removed from over the sidewall spacer and the gate structure to expose a portion of a top surface of the gate electrode, and a portion of the sidewall spacer is modified with an amorphization process. After modifying the portion of the sidewall spacer with the amorphization process, the portion of the sidewall spacer is removed with an etching process to expose a portion of the gate dielectric layer. The portion of the gate dielectric layer is removed to expose a portion of the sidewall of the gate electrode. A cross-coupling contact is formed that directly connects the portion of the top surface of the gate electrode and the portion of the sidewall of the gate electrode with the epitaxial semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
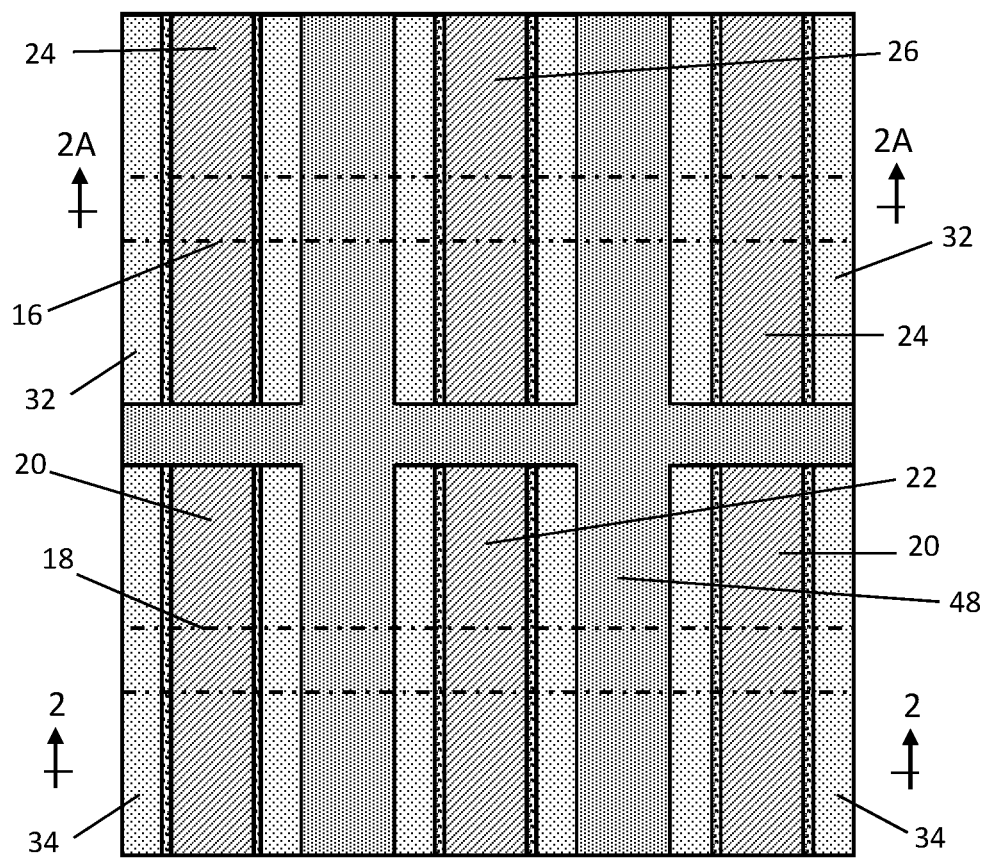
FIG. 1 is a top view of a structure at an initial fabrication stage of a processing method in accordance with embodiments of the invention.
Figure 2:
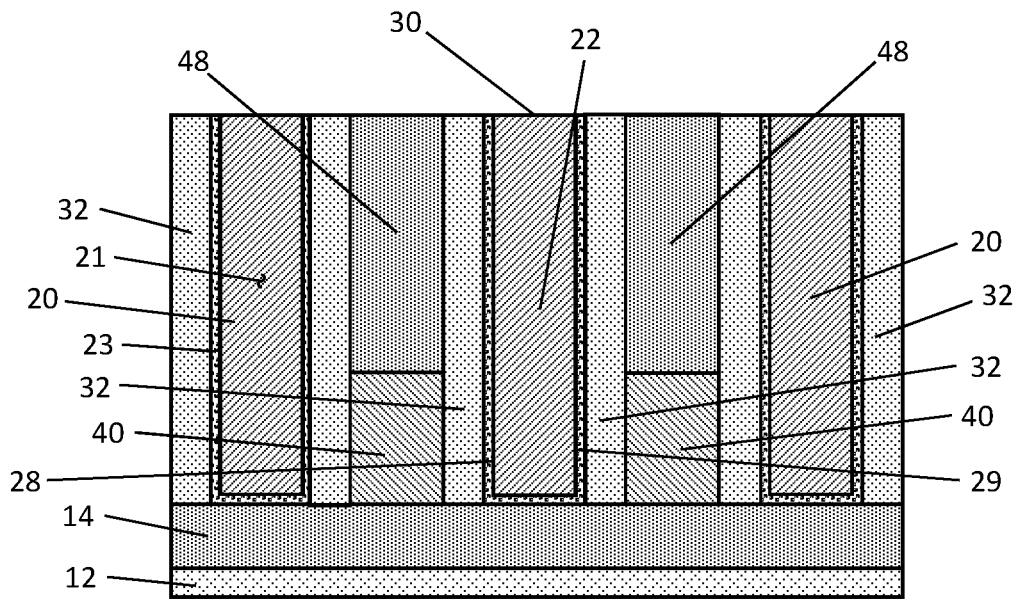
FIG. 2 is a cross-sectional view taken generally along line 2-2 in FIG. 1.
Figure 2A:
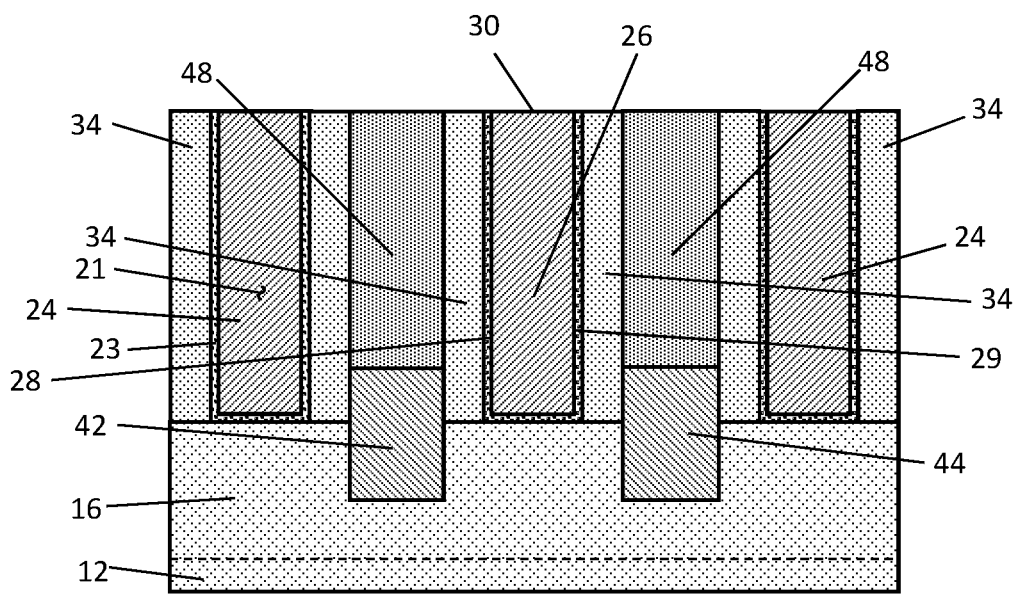
FIG. 2A is a cross-sectional view taken generally along line 2A-2A in FIG. 1.

With reference to FIGS. 1, 2, 2A and in accordance with embodiments of the invention, fins 16, 18 are formed that project from a top surface of a substrate 12. The fins 16, 18 may be formed by patterning the single-crystal semiconductor material (e.g., single-crystal silicon) of the substrate 12 with lithography and etching processes, and may include cuts that provide a layout associated with the specific device structures being formed and their arrangement. Trench isolation regions 14 are formed that operate to electrically isolate the fins 16, 18 from each other. The trench isolation regions 14 may be formed by depositing a layer composed of a dielectric material, such as an oxide of silicon (e.g., silicon dioxide), by chemical vapor deposition, and recessing with an etching process to expose an upper portion of each of the fins 16, 18.

Gate structures 20, 22, 24, 26 are formed that extend over the fins 16, 18 and the trench isolation regions 14. The gate structures 20, 22 formed in one region of the integrated circuit structure overlap with the fin 18, and the gate structures 24, 26 formed in another region of the integrated circuit structure overlap with the fin 16. The gate structures 20, 22, 24, 26 may each include a gate electrode 21 and a gate dielectric layer 23 that is composed of a dielectric material, such as a high-k dielectric material like hafnium oxide. The gate electrode 21 may include one or more conformal barrier metal layers and/or work function metal layers, such as layers composed of titanium aluminum carbide and/or titanium nitride, and a metal gate fill layer composed of a conductor, such as tungsten. The gate electrode 21 of the gate structures 20, 22 and the gate electrode 21 of the gate structures 24, 26 may contain different combinations of the conformal barrier metal layers and/or work function metal layers. For example, the gate electrode 21 of the gate structures 20, 22 may include conformal work function metal layers characteristic of a p-type field-effect transistor, and the gate electrode 21 of the gate structures 24, 26 may include conformal work function metal layers characteristic of an n-type field-effect transistor.

The gate electrode 21 of each of the gate structures 20, 22, 24, 26 includes a side surface or sidewall 28 and a side surface or sidewall 29 that is opposite from the sidewall 28, as well as a top surface 30 that connects the sidewalls 28, 29. The sidewalls 28, 29 are covered by sections of the gate dielectric layer 23 and the top surface 30 is not covered by the gate dielectric layer 23. Sidewall spacers 32 are arranged adjacent to the gate structures 20, 22 at the opposite sidewalls 28, 29 of the respective gate electrodes 21, and sidewall spacers 34 are arranged adjacent to the gate structures 24, 26 at the opposite sidewalls 28, 29 of the respective gate electrodes 21. The sidewall spacers 32, 34 may be may be composed of a low-k dielectric material, such as SiOCN, that is deposited and etched with an anisotropic etching process, such as reactive ion etching.

Semiconductor layers 40 are epitaxially grown from the fins 18 by an epitaxial growth process, and semiconductor layers 42, 44 are epitaxially grown from the fins 16 by an epitaxial growth process. In an embodiment, the epitaxial semiconductor layers 40 may contain silicon-germanium doped during epitaxial growth with a p-type dopant (e.g., boron, aluminum, gallium, and/or indium) that provides p-type electrical conductivity, and the epitaxial semiconductor layers 42, 44 may contain silicon doped during epitaxial growth with an n-type dopant (e.g., phosphorus and/or arsenic) that provides n-type electrical conductivity. Due to lateral growth during the epitaxial growth processes, portions of the epitaxial semiconductor layers 40 are arranged between the gate structures 20, 22, and portions of the epitaxial semiconductor layers 42, 44 are arranged between the gate structures 24, 26. The epitaxial semiconductor layers 40 furnish source/drain regions for field-effect transistors formed using the fin 18, and the epitaxial semiconductor layers 42, 44 furnish source/drain regions for field-effect transistors formed using the fin 16. As used herein, the term "source/drain region" means a doped region of semiconductor material that can function as either a source or a drain of a field-effect transistor.

An interlayer dielectric layer 48 is formed in spaces over the epitaxial semiconductor layers 40, 42, 44. In particular, a section of the interlayer dielectric layer 48 is arranged adjacent to the sidewall 28 of the gate electrode 21 of the gate structure 26, and another section of the interlayer dielectric layer 48 is arranged adjacent to the sidewall 29 of the gate electrode 21 of the gate structure 26. The interlayer dielectric layer 48 may be composed of a dielectric material, such as an oxide of silicon (e.g., silicon dioxide), that may be deposited by chemical vapor deposition and planarized, and that is different in composition from the dielectric material of the sidewall spacers 32, 34.

Figure 3:
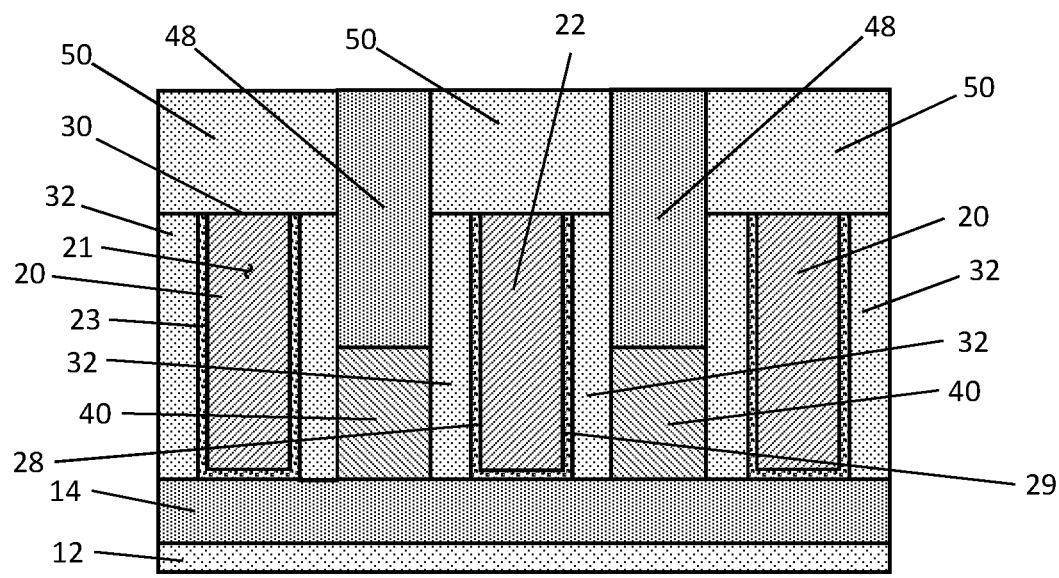
FIGS. 3-9 and 3A-9A are cross-sectional views of the structure at successive fabrication stages of the processing method respectively subsequent to FIGS. 2 and 2A.
Figure 3A:
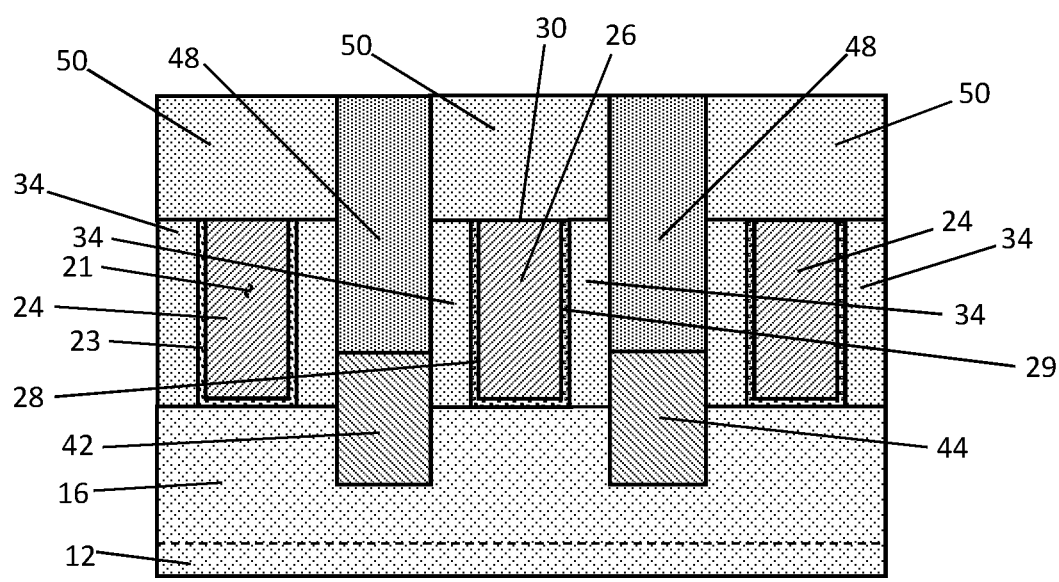

With reference to FIGS. 3 and 3A in which like reference numerals refer to like features in FIGS. 2 and 2A and at a subsequent fabrication stage of the processing method, self-aligned contact caps 50 are formed over the gate structures 20, 22, 24, 26 and sidewall spacers 32, 34. The self-aligned contact caps 50 are disposed in cavities formed by recessing the gate structures 20, 22, 24, 26 and sidewall spacers 32, 34 with one or more etching processes selective to the material contained in the sections of the interlayer dielectric layer 48. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The self-aligned contact caps 50 may be composed of a dielectric material, such as silicon nitride, that is deposited by chemical vapor deposition and then planarized with chemical-mechanical polishing.

Figure 4:
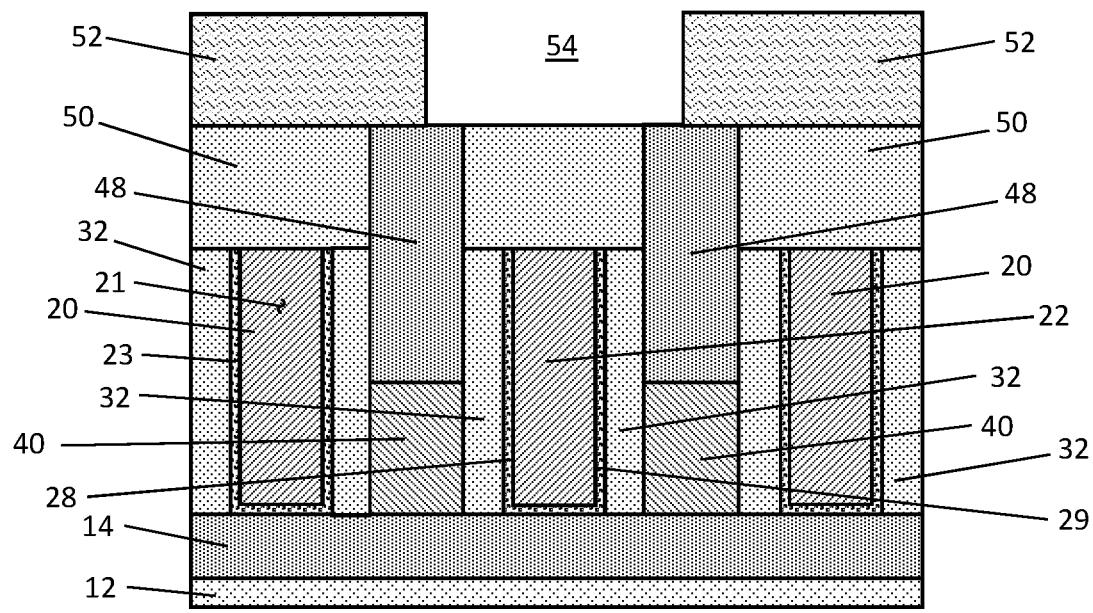
Figure 4A:
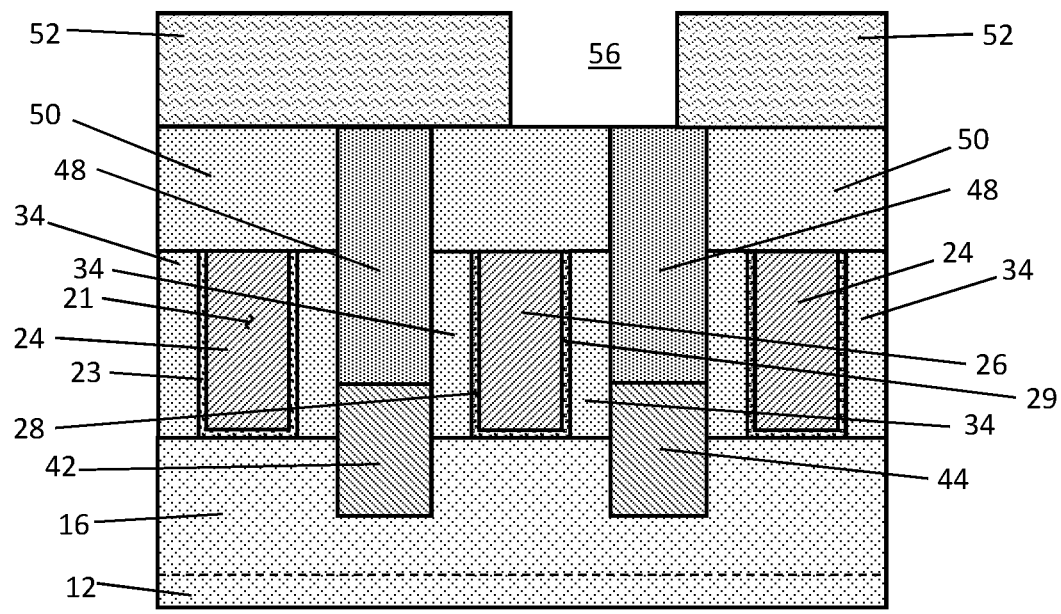

With reference to FIGS. 4 and 4A in which like reference numerals refer to like features in FIGS. 3 and 3A and at a subsequent fabrication stage of the processing method, an etch mask 52 is formed by applying a lithography stack and patterning the lithography stack to generate openings 54, 56. The etch mask 52 may include an organic planarization layer (OPL) material and an anti-reflection coating in the lithography stack that are patterned with lithography and etching processes.

The opening 54 in the etch mask 52 exposes the self-aligned contact cap 50 over the gate structure 22, as well as the sections of the interlayer dielectric layer 48 that are arranged adjacent to both sidewalls 28, 29 of the gate electrode 21 of the gate structure 22. The opening 56 in etch mask 52 exposes a portion of the self-aligned contact cap 50 over the gate structure 26, as well as the section of the interlayer dielectric layer 48 only adjacent to the sidewall 29 of the gate electrode 21 of the gate structure 26. A portion of the self-aligned contact cap 50 over the gate structure 26 is covered and masked by the etch mask 52.

The opening 54 in the etch mask 52 defines a location for the subsequent formation of a gate contact extending to the gate structure 22. The opening 56 in the etch mask 52 defines a location for the subsequent formation of a cross-coupling contact connecting the gate electrode 21 of the gate structure 26 with the epitaxial semiconductor layer 44 that is arranged adjacent to the gate structure 26.

Figure 5:
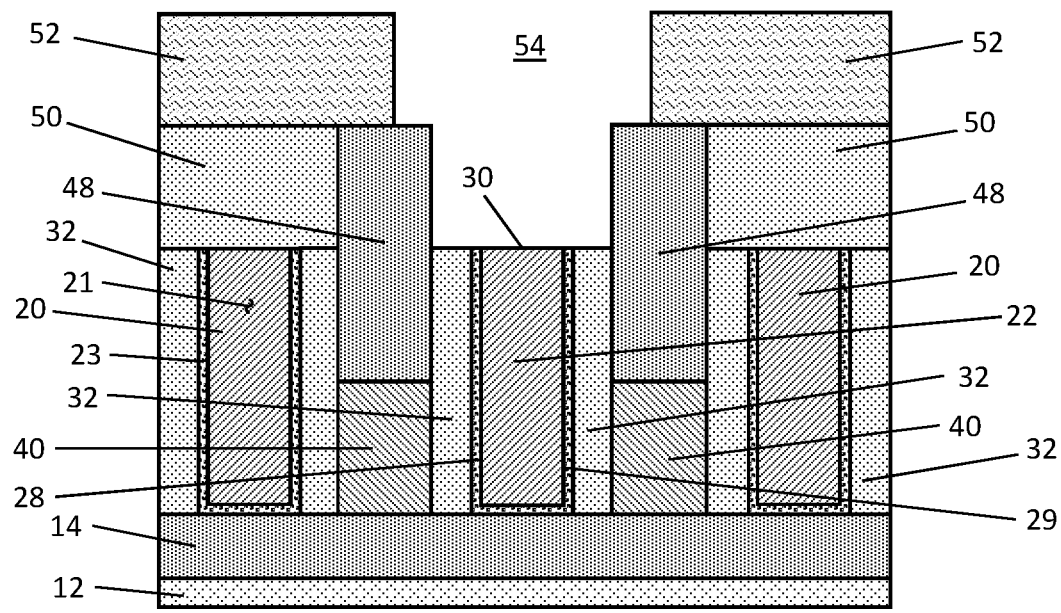
Figure 5A:
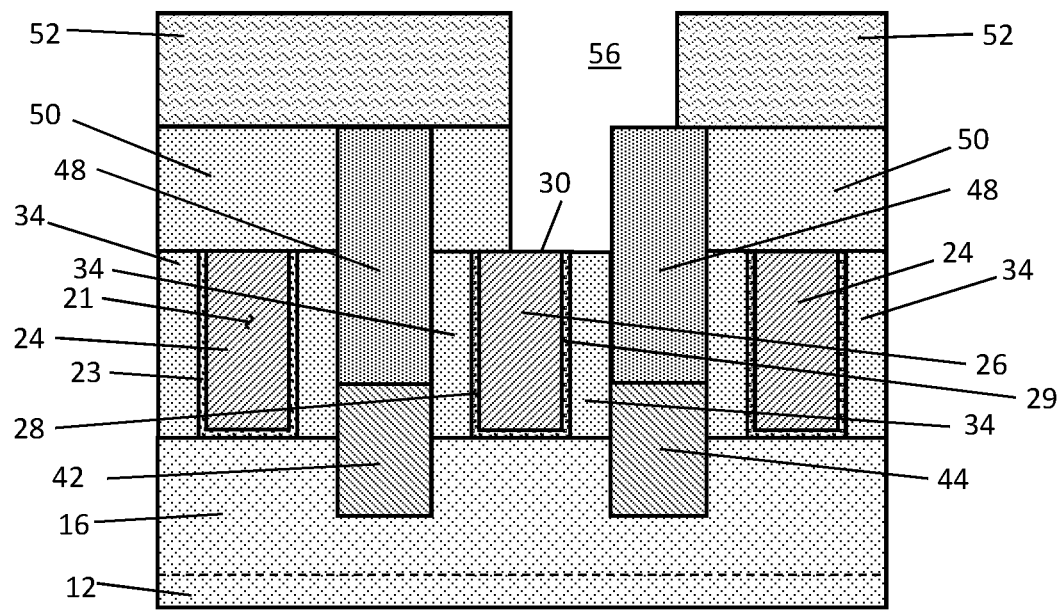

With reference to FIGS. 5 and 5A in which like reference numerals refer to like features in FIGS. 4 and 4A and at a subsequent fabrication stage of the processing method, the self-aligned contact cap 50 exposed by the opening 54 in the etch mask 52 over the gate structure 22 and the portion of self-aligned contact cap 50 exposed by the opening 56 in the etch mask 52 over the gate structure 26 are etched and removed with an etching process, such as a reactive ion etching process. The self-aligned contact cap 50 is completely removed from over the top surface 30 of the gate electrode 21 of the gate structure 22.

A portion of the top surface 30 is exposed by the partial removal of the self-aligned contact cap 50 over the gate structure 26. Another portion of the gate electrode 21 of the gate structure 26 and the sidewall spacer 34 at the sidewall 28 of the gate electrode 21 of the gate structure 26 remains covered by the partially-removed self-aligned contact cap 50. In conventional fabrication processes forming cross-coupling contacts, the self-aligned contact cap is not etched until after removal of the interlayer dielectric layer for trench silicide formation.

Figure 6:
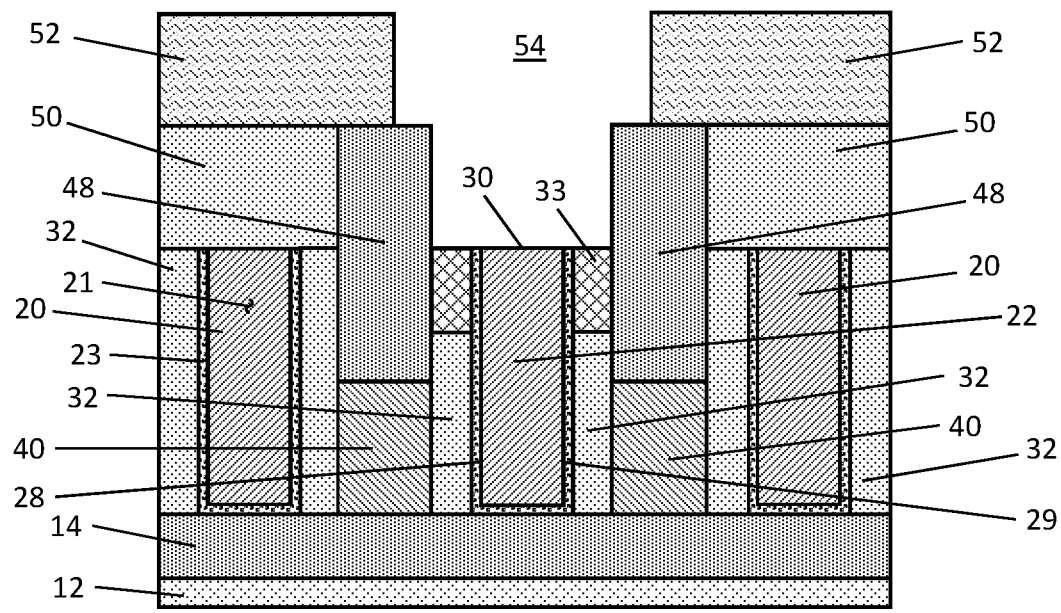
Figure 6A:
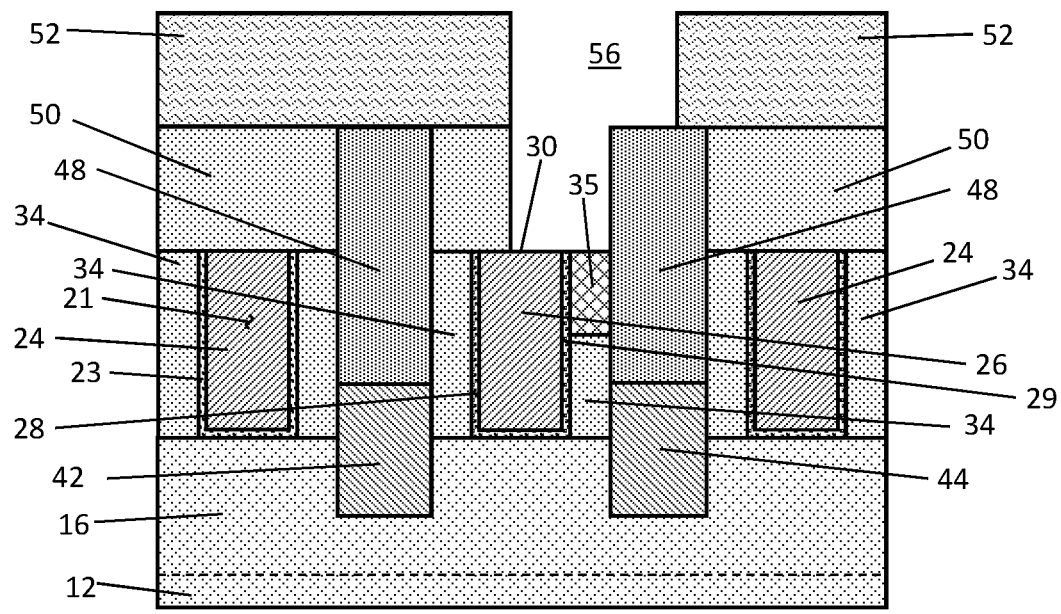

With reference to FIGS. 6 and 6A in which like reference numerals refer to like features in FIGS. 5 and 5A and at a subsequent fabrication stage of the processing method, respective upper portions 33 of the sidewall spacers 32 that are exposed through the opening 54 and an upper portion 35 of the sidewall spacer 34 that is exposed through the opening 56 in the etch mask 52 are modified in order to increase their etch rate in comparison with their unmodified condition. The gate structures 22, 26 and the sections of the interlayer dielectric layer 48 exposed through the openings 54, 56 in the etch mask 52 are also subjected to the modification process, which preferably has a negligible effect on their material and physical properties. In an embodiment, the upper portions 33 of the sidewall spacers 32 and the upper portion 35 of the sidewall spacer 34 may be subjected to an amorphization process.

The modification process is controlled during its performance such that lower portions of these sidewall spacers 32, 34 are not modified and thereby has a lower etch rate than the upper portions 33, 35. The lower portions of the sidewall spacers 32 are arranged between the trench isolation regions 14 and the upper portions 33 of the sidewall spacers 32. The lower portions of the sidewall spacers 34 are arranged between the fin 16 and the upper portions 35 of the sidewall spacers 33.

In an embodiment, the modification or amorphization process may be ion implantation introducing energetic ions that damage the upper portions 33, 35 of the sidewall spacers 32, 34 as the kinetic energy of the implanted ions is dissipated by nuclear collisions with atoms of the dielectric material forming the sidewall spacers 32, 34. The nuclear collisions may cause a rearrangement within the dielectric material of the sidewall spacers 32, 34 in which the target atoms are displaced from their original positions to new positions at which original local atomic coordination is not recovered, thereby generating broken atomic bonds. The damage to the upper portions 33, 35 of the sidewall spacers 32, 34 increases their sensitivity to an etching process (i.e., their etch rate during the etching process) in comparison with the respective undamaged lower portions of the sidewall spacers 32, 34 that are not modified by the ion implantation.

The ions may be generated from a suitable source gas and implanted into the upper portions 33, 35 of the sidewall spacers 32, 34 with selected implantation conditions using an ion implantation tool. The implantation conditions (e.g., ion species, dose, kinetic energy) may be selected to tune the characteristics (e.g., depth profile, amount of damage) of the upper portions 33, 35 of the sidewall spacers 32, 34. In an embodiment, the ions may be generated from argon or another type of noble atom gas or inert gas. The ion implantation is performed with limits on the implantation conditions such that the lower portions of the sidewall spacers 32, 34 are not damaged.

In an embodiment, the modification or amorphization process may be an ozone treatment that treats the upper portions 33, 35 of the sidewall spacers 32, 34. The ozone treatment may modify the dielectric material of the sidewall spacers 32, 34 such that the upper portions 33, 35 are enriched in their oxygen content relative to the oxygen content of the lower portions of the sidewall spacers 32, 34. The higher oxygen content of the upper portions 33, 35 increases their sensitivity to an etching process in comparison with respective lower portions of the sidewall spacers 32, 34 having a lower oxygen content.

In an alternative embodiment, the ions may be generated from oxygen such that, in addition to the damage that is introduced by ion implantation, the oxygen content of the upper portions 33, 35 of the sidewall spacers 32, 34 is increased to be greater than the oxygen content of the non-implanted lower portions of the sidewall spacers 32, 34.

Figure 7:
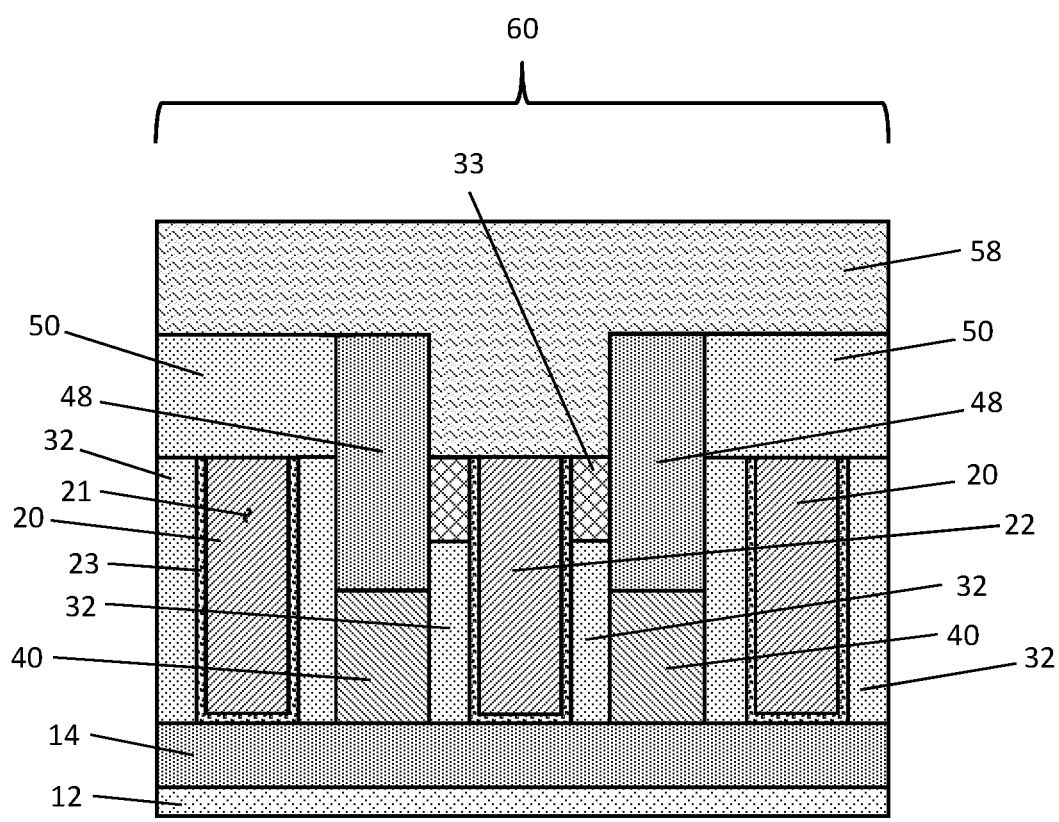
Figure 7A:
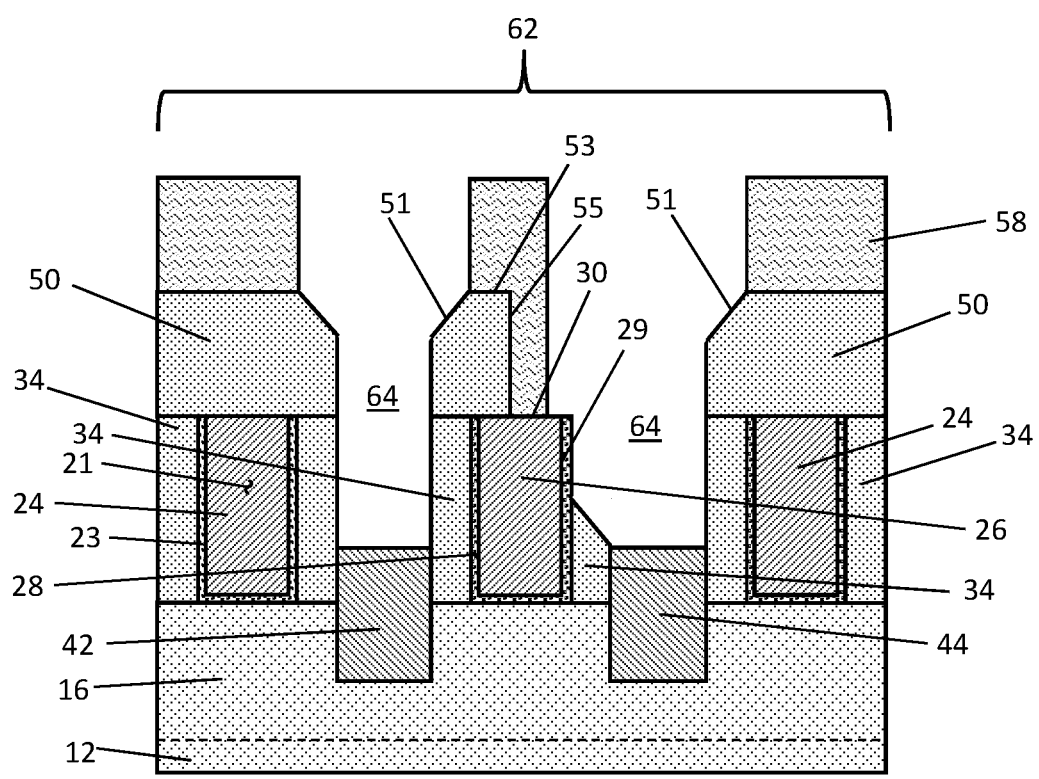

With reference to FIGS. 7 and 7A in which like reference numerals refer to like features in FIGS. 6 and 6A and at a subsequent fabrication stage of the processing method, an etch mask 58 is formed by applying a lithography stack and patterning the lithography stack. The etch mask 58 covers an area 60 including the gate structures 20, 22 and is patterned to partially expose an area 62 including the gate structures 24, 26. The etch mask 58 may include an organic planarization layer (OPL) material and an anti-reflection coating in the lithography stack that are patterned with lithography and etching processes.

The upper portion 35 of the sidewall spacer 34 arranged adjacent to the sidewall 29 of the gate electrode 21 of the gate structure 26 is removed by an etching process. The etching process may be a reactive ion etching process that removes the material of the upper portion 35 of the sidewall spacer 34 selective to the materials of the gate electrode 21 and gate dielectric layer 23 of the gate structure 26. The upper portion 35 of the sidewall spacer 34 has an elevated etch rate during the etching process facilitated by the modification process. The lower portion of the sidewall spacer 34 may also be etched with a lower etching rate than the upper portion 35, but not fully removed. The result is that the sidewall spacer 34 is recessed relative to the top surface 30 of the gate structure 26, which exposes a portion of the gate dielectric layer 23 at and/or on the sidewall 29 of the gate electrode 21.

The sections of the interlayer dielectric layer 48 exposed in the area 62 adjacent to the gate structure 24 and adjacent to gate structure 26 are removed to expose the underlying sections of the epitaxial semiconductor layers 42, 44. The removal of these sections of the interlayer dielectric layer 48, in conjunction with the removal of the upper portion 35 of the sidewall spacer 34, generates openings 64. The sections of the interlayer dielectric layer 48 may be etched, for example, by a reactive ion etching process that removes the material of the interlayer dielectric layer 48 selective to the material of the gate electrode 21 and gate dielectric layer 23 of the gate structure 26. In an embodiment, the sections of the interlayer dielectric layer 48 and the upper portion 35 of the sidewall spacer 34 may be removed by the same etching process.

The upper portions 33 of the sidewall spacers 32 adjacent to the gate electrode 21 of the gate structure 22 are covered and fully protected by the etch mask 58. The sidewall spacer 34 adjacent to the sidewall 28 of the gate electrode 21 of the gate structure 26 is covered and fully protected by the self-aligned contact cap 50. The self-aligned contact caps 50 include a top surface 53 and opposite sidewalls 55. Portions of the self-aligned contact caps 50 over the gate structures 24 and a portion of the self-aligned contact cap 50 over the gate structure 26 are exposed by the etch mask 58 at the edges of the openings 64. These exposed portions of the self-aligned contact caps 50 are eroded by the etching process such that their corners are transformed into beveled surfaces 51. Each beveled surface 51 connects the top surface 53 with the sidewall 55. In contrast, a portion of the self-aligned contact cap 50 over the top surface 30 of the gate structure 26 is masked by the etch mask 58. As a result, the corner at the intersection of the top surface 53 and the sidewall 55 is not eroded and beveled by the etching process. In an embodiment, the top surface 53 and the sidewall 55 may intersect at an angle of approximately 90° to define the corner.

The sidewall spacer 34 adjacent to the sidewall 29 of the gate electrode 21 of the gate structure 26 is shorter in height than the sidewall spacer 34 adjacent to the sidewall 28 of the gate electrode 21 of the gate structure 26. These heights may be measured, for example, relative to the top surface of the fin 16.

Figure 8:
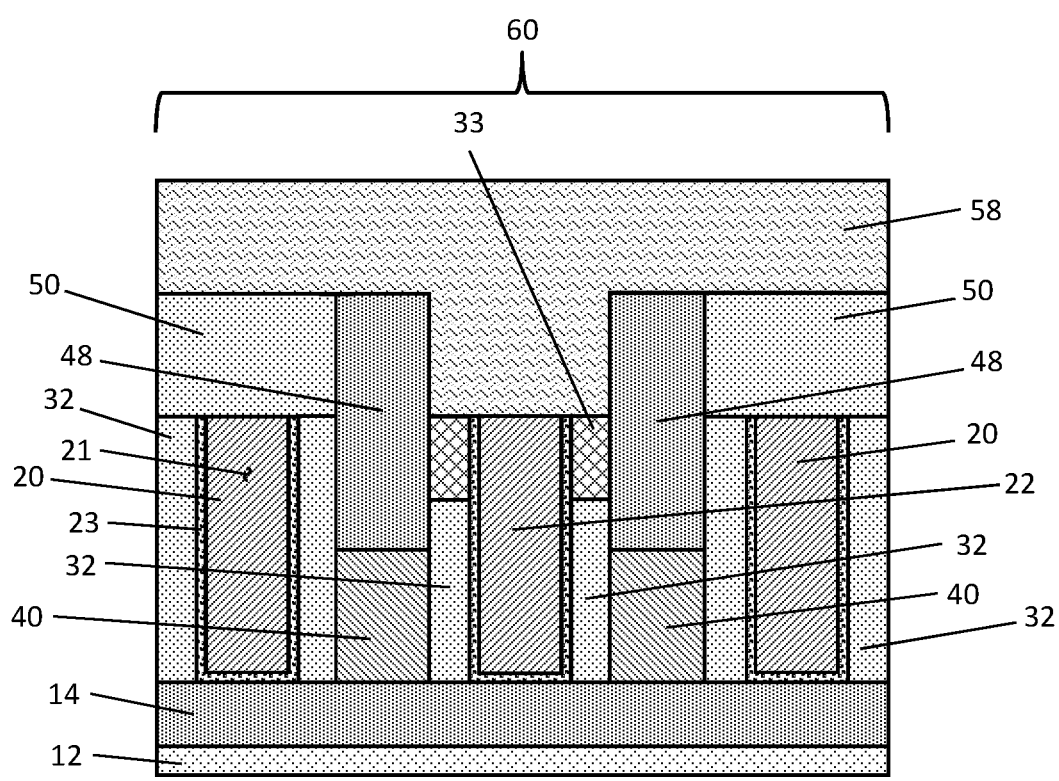
Figure 8A:
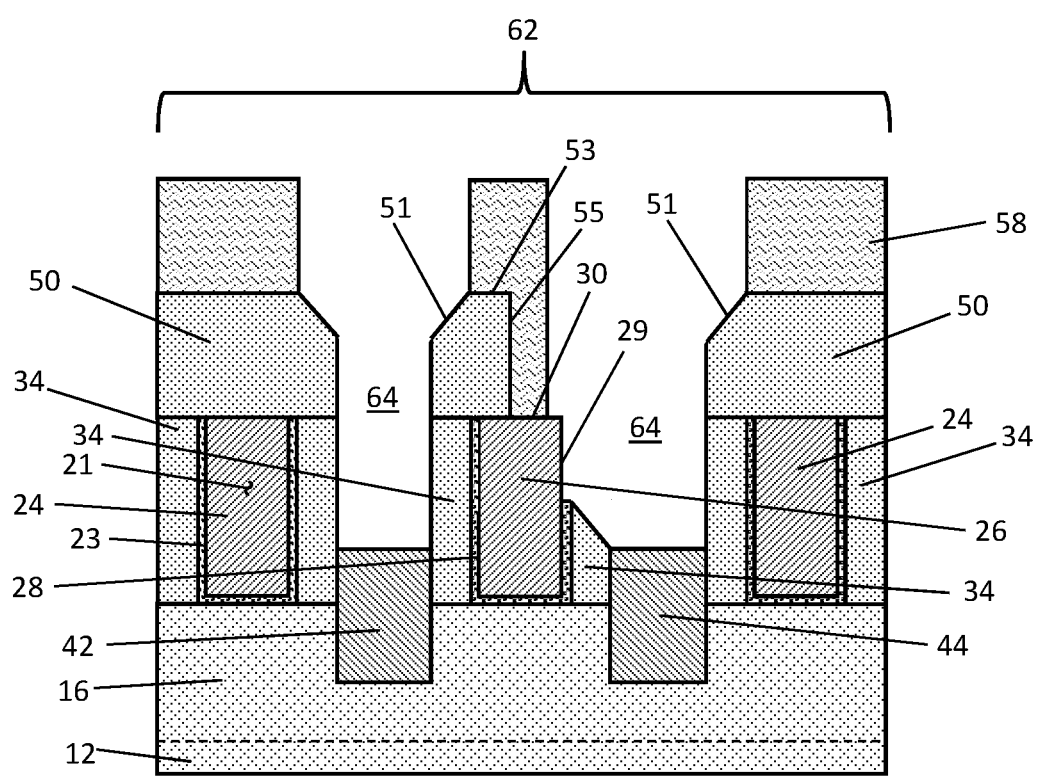

With reference to FIGS. 8 and 8A in which like reference numerals refer to like features in FIGS. 7 and 7A and at a subsequent fabrication stage of the processing method, the exposed gate dielectric layer 23 is removed from the sidewall 29 of the gate electrode 21 of the gate structure 26 to expose a portion of the sidewall 29 of the gate electrode 21. This portion of the sidewall 29 of the gate electrode 21 is arranged above the partially-removed sidewall spacer 34. The gate dielectric layer 23 of the gate structure 26 may be removed by an etching process that is selective to the material of the gate electrode 21. The gate dielectric layer 23 of the gate structure 26 is preserved between the sidewall spacer 34 and the gate electrode 21 of the gate structure 26. Following the performance of the etching process, the etch mask 58 is removed by, for example, an ashing process.

Figure 9:
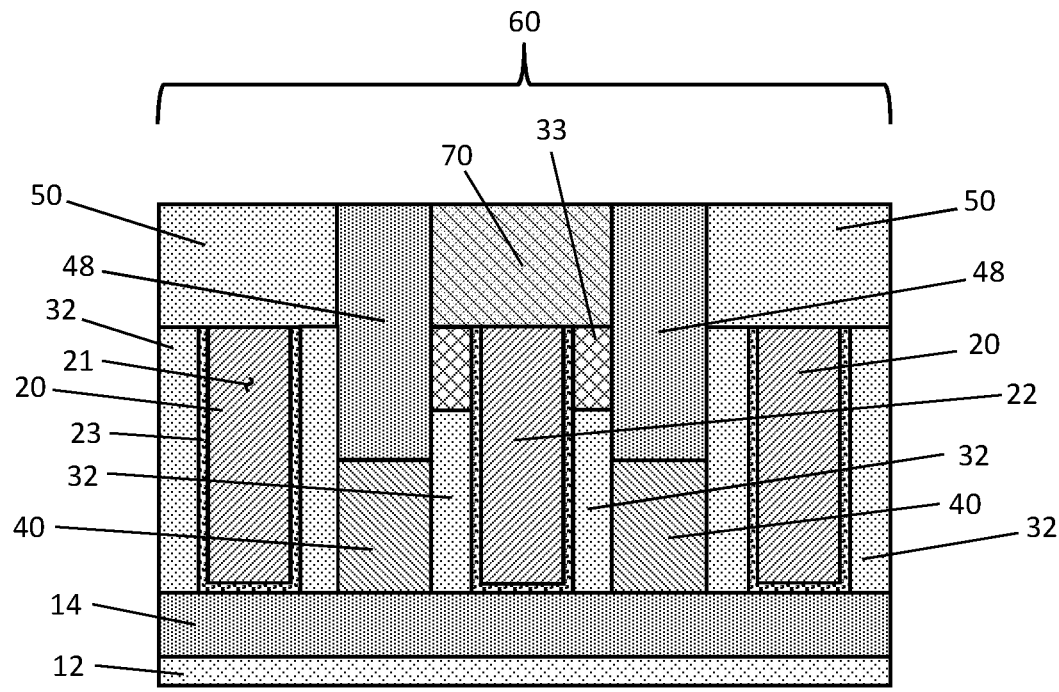
Figure 9A:
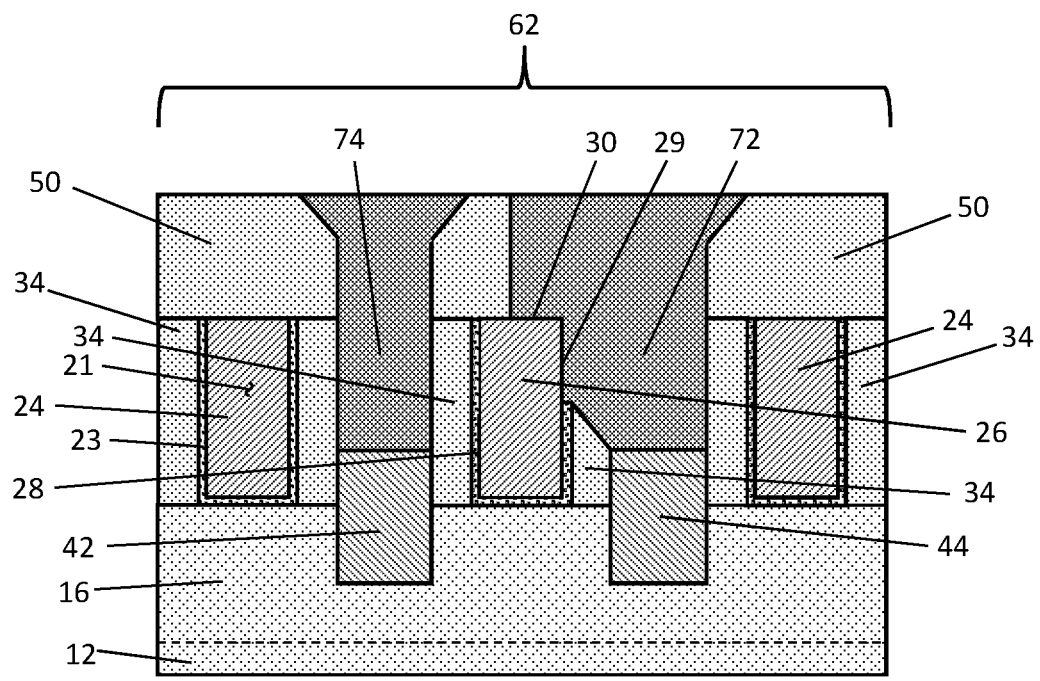

With reference to FIGS. 9 and 9A in which like reference numerals refer to like features in FIGS. 8 and 8A and at a subsequent fabrication stage of the processing method, a gate contact 70 may be formed over gate structure 22 and a cross-coupling contact 72 may be formed over the gate structure 26, sidewall spacer 34, and epitaxial semiconductor layer 44. The gate contact 70 and the cross-coupling contact 72, which may be concurrently formed, may contain a metal silicide layer and a metal fill layer (e.g., tungsten) deposited by chemical vapor deposition or atomic layer deposition and then planarized by a chemical-mechanical planarization process. A source/drain contact 74 may also be formed that extends to the epitaxial semiconductor layer 42 either concurrently with the formation of the contacts 70, 72 or separately. The source/drain contact 74 is arranged adjacent to the beveled surface 51 of the self-aligned contact cap 50 over the portion of the gate structure 26.

The cross-coupling contact 72 connects the gate electrode 21 of the gate structure 26 with the epitaxial semiconductor layer 44. The gate contact 70 has a directly contacting relationship with the gate electrode 21 of the gate structure 22. The cross-coupling contact 72 directly contacts the portions of the sidewall 39 of the gate electrode 21 of the gate structure 26 from which the gate dielectric layer 23 has been removed. The cross-coupling contact 72 also directly contacts the top surface 30 of the gate electrode 21 of the gate structure 26 and the epitaxial semiconductor layer 44 adjacent to the gate structure 26. Following planarization, the cross-coupling contact 72 has a thickness and area of contact with the gate electrode 21 of the gate structure 26 at its sidewall 29 and top surface 30 that is increased by the removal of the modified upper portion 35 of the sidewall spacer 36.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly" on or in "direct contact" with another feature if intervening features are absent. A feature may be "indirectly" on or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor fin;
   a first sidewall spacer;
   a second sidewall spacer;
   a first gate structure having an overlapping arrangement with the semiconductor fin, the first gate structure including a first gate electrode and a gate dielectric arranged between the first sidewall spacer and the second sidewall spacer, the first gate electrode having a top surface and a first sidewall adjacent to the first sidewall spacer;
   a first epitaxial semiconductor layer arranged adjacent to the first sidewall of the first gate electrode; and
   a cross-coupling contact extending over the first sidewall spacer to connect the first gate electrode with the first epitaxial semiconductor layer, the cross-coupling contact having a directly contacting relationship with a first portion of the top surface of the first gate electrode and a portion of the first sidewall of the first gate electrode.

2. The structure of claim 1 further comprising:
   a trench isolation region;
   a second gate structure arranged over the trench isolation region;
   a gate contact over the second gate structure; and
   a third sidewall spacer adjacent to the second gate structure, the third sidewall spacer including a lower portion with a first oxygen content and an upper portion with a second oxygen content that is greater than the first oxygen content, and the upper portion of the third sidewall spacer arranged closer to the gate contact than the lower portion of the third sidewall spacer.

3. The structure of claim 1 further comprising:
a trench isolation region;
a second gate structure arranged over the trench isolation region;
a gate contact over the second gate structure; and
a third sidewall spacer adjacent to the second gate structure, the third sidewall spacer comprised of a dielectric material including an upper portion containing damage and a lower portion lacking the damage, and the upper portion of the third sidewall spacer arranged closer to the gate contact than the lower portion of the third sidewall spacer.

4. The structure of claim 1 wherein the first gate electrode has a second sidewall, the second sidewall spacer is arranged adjacent to the second sidewall of the first gate electrode, further comprising:
a second epitaxial semiconductor layer arranged adjacent to the second sidewall spacer; and
a dielectric cap over a second portion of the top surface of the first gate electrode, the dielectric cap including a top surface, a first sidewall that joins the top surface at a corner over the first gate electrode, a second sidewall, and a beveled surface that connects the second sidewall with the top surface over the second sidewall spacer; and
a contact extending to the second epitaxial semiconductor layer.

5. A method comprising:
forming a first gate structure that includes a first gate electrode and a gate dielectric layer;
forming a first sidewall spacer adjacent to a first sidewall of the first gate electrode;
forming a dielectric cap over the first gate structure and the first sidewall spacer;
forming a first epitaxial semiconductor layer adjacent to the first sidewall spacer;
removing a first portion of the dielectric cap from over the first sidewall spacer and the first gate structure to expose a portion of a top surface of the first gate electrode;
modifying a first portion of the first sidewall spacer with an amorphization process;
after modifying the first portion of the first sidewall spacer with the amorphization process, removing the first portion of the first sidewall spacer with an etching process to expose a portion of the gate dielectric layer;
removing the portion of the gate dielectric layer to expose a portion of the first sidewall of the first gate electrode; and
forming a cross-coupling contact that directly connects the portion of the top surface of the first gate electrode and the portion of the first sidewall of the first gate electrode with the first epitaxial semiconductor layer.

6. The method of claim 5 wherein the first sidewall spacer is comprised of a dielectric material, and modifying the first portion of the first sidewall spacer with the amorphization process comprises:
damaging the dielectric material of the first portion of the first sidewall spacer.

7. The method of claim 6 wherein the first portion of the first sidewall spacer is arranged over a second portion of the first sidewall spacer, the dielectric material of the first portion of the first sidewall spacer includes damage following the amorphization process, and the first portion of the first sidewall spacer has an elevated etch rate relative to the second portion of the first sidewall spacer during the etching process due to the damage.

8. The method of claim 7 wherein damaging the dielectric material of the first portion of the first sidewall spacer comprises:
implanting the first portion of the first sidewall spacer with ions in an implantation process.

9. The method of claim 6 further comprising:
removing a section of an interlayer dielectric layer to expose the first epitaxial semiconductor layer,
wherein the section of the interlayer dielectric layer is removed by the etching process.

10. The method of claim 5 wherein the first sidewall spacer is comprised of a dielectric material, and modifying the first portion of the first sidewall spacer with the amorphization process comprises:
increasing an oxygen content of the dielectric material of the first portion of the first sidewall spacer with an ozone treatment.

11. The method of claim 10 wherein the first portion of the first sidewall spacer is arranged over a second portion of the first sidewall spacer, the oxygen content of the dielectric material of the first portion of the first sidewall spacer is greater than the oxygen content of the dielectric material of the second portion of the first sidewall spacer following the ozone treatment, and the first portion of the first sidewall spacer has an elevated etch rate relative to the second portion of the first sidewall spacer during the etching process due to the oxygen content.

12. The method of claim 11 further comprising:
removing a section of an interlayer dielectric layer to expose the first epitaxial semiconductor layer,
wherein the section of the interlayer dielectric layer is removed by the etching process.

13. The method of claim 5 wherein the first portion of the first sidewall spacer is modified after removing the first portion of the dielectric cap.

14. The method of claim 5 wherein the cross-coupling contact extends over the first sidewall spacer to directly connect the portion of the top surface of the first gate electrode and the portion of the first sidewall of the first gate electrode with the first epitaxial semiconductor layer.

15. The method of claim 5 wherein a second sidewall spacer is arranged adjacent to a second sidewall of the first gate electrode that is opposite to the first sidewall of the first gate electrode, and the dielectric cap includes a second portion arranged over the second sidewall spacer after the first portion of the dielectric cap is removed.

16. The method of claim 5 further comprising:
forming a second gate structure that includes a second gate electrode;
forming a second sidewall spacer adjacent to a sidewall of the second gate electrode; and
modifying a portion of the second sidewall spacer with the amorphization process.

17. The method of claim 16 further comprising:
forming an etch mask that covers the second sidewall spacer and the second gate electrode when removing the first portion of the first sidewall spacer.

18. The method of claim 17 further comprising:
removing the etch mask; and
forming a gate contact coupled with the second gate electrode, wherein the gate contact is arranged over the second sidewall spacer, and the cross-coupling contact and the gate contact are concurrently formed.

19. The method of claim 16 wherein the first sidewall spacer and the second sidewall spacer are comprised of a dielectric material, and modifying the portion of the second sidewall spacer with the amorphization process comprises:
   damaging the dielectric material of the portion of the second sidewall spacer.

20. The method of claim 16 wherein the first sidewall spacer and the second sidewall spacer are comprised of a dielectric material, and modifying the portion of the second sidewall spacer with the amorphization process comprises:
   increasing an oxygen content of the dielectric material of the portion of the second sidewall spacer with an ozone treatment.

* * * * *